(12) United States Patent
Chang et al.

(10) Patent No.: US 11,270,945 B2
(45) Date of Patent: Mar. 8, 2022

(54) SEMICONDUCTOR DEVICE

(71) Applicant: United Microelectronics Corp., Hsinchu (TW)

(72) Inventors: Chu Chun Chang, Kaohsiung (TW); Yu Chen Chao, Yilan County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 16/945,437

(22) Filed: Jul. 31, 2020

(65) Prior Publication Data

US 2021/0391262 A1    Dec. 16, 2021

(30) Foreign Application Priority Data

Jun. 12, 2020 (CN) .......................... 202010535231.8

(51) Int. Cl.
| | |
|---|---|
| H01L 21/768 | (2006.01) |
| H01L 23/532 | (2006.01) |
| H01L 23/535 | (2006.01) |
| H01L 29/06 | (2006.01) |
| H01L 29/78 | (2006.01) |
| H01L 29/417 | (2006.01) |

(52) U.S. Cl.
CPC ...... *H01L 23/5329* (2013.01); *H01L 21/7682* (2013.01); *H01L 21/76805* (2013.01); *H01L 21/76895* (2013.01); *H01L 23/535* (2013.01); *H01L 29/0649* (2013.01); *H01L 29/41725* (2013.01); *H01L 29/7838* (2013.01)

(58) Field of Classification Search
CPC ......... H01L 23/02; H01L 23/50; H01L 23/52; H01L 23/532; H01L 23/535; H01L 21/768; H01L 21/3213; H01L 21/32133; H01L 21/76802; H01L 21/7682; H01L 21/76805; H01L 21/76895; H01L 29/06; H01L 29/78; H01L 29/417; H01L 29/0649; H01L 29/41725; H01L 29/7238; H01L 29/66; H01L 29/40; H01L 29/6653; H01L 29/66795; H01L 29/66553; H01L 29/401; H01L 29/49; H01L 29/41775; H01L 29/41791; H01L 29/423; H01L 29/6656; H01L 29/4991; H01L 29/66545; H01L 29/4236; H01L 29/4966; H01L 21/28; H01L 21/28088; H01L 21/764; H01L 21/762; H01L 21/28273; H01L 21/76224; H01L 21/76841; H01L 21/76897; H01L 21/8238; H01L 21/823864; H01L 21/823871; H01L 23/10
USPC ......................................................... 257/348
See application file for complete search history.

(56) References Cited

U.S. PATENT DOCUMENTS

| | | |
|---|---|---|
| 6,211,057 B1 | 4/2001 | Lin et al. |
| 10,211,146 B2 | 2/2019 | He et al. |

(Continued)

*Primary Examiner* — Chuong A Luu
(74) *Attorney, Agent, or Firm* — J.C. Patents

(57) ABSTRACT

A semiconductor device includes a substrate, having a silicon layer on top. A device structure is disposed on the substrate. A dielectric layer is disposed on the substrate and covering over the device structure. The dielectric layer has a first air gap above the device structure. The first air gap is enclosed by a dielectric wall constituting as a part of the dielectric layer and the dielectric wall is disposed on the device structure. The dielectric layer has a second air gap, exposing a top of the device structure and adjacent to the dielectric wall.

21 Claims, 9 Drawing Sheets

(56) References Cited

U.S. PATENT DOCUMENTS 10,515,876 B1 12/2019 Zhou
2014/0264896 A1* 9/2014 Lu .................... H01L 23/535
257/773

* cited by examiner

SEMICONDUCTOR DEVICE

CROSS-REFERENCE TO RELATED APPLICATION

This application claims the priority benefit of Chinese patent application serial no. 202010535231.8, filed on Jun. 12, 2020. The entirety of the above-mentioned patent application is hereby incorporated by reference herein and made a part of this specification.

BACKGROUND OF THE INVENTION

Field of the Invention

The invention relates to a semiconductor fabrication technology, in particular, to a structure and a method of fabricating a semiconductor device.

Description of Related Art

Integrated circuit usually includes a large number of devices, such as transistor devices and the interconnect structure connected therebetween. The integrated circuit in an example includes the control circuits or operation circuit, or the storage device for storing digital data. In accordance with the improved capability of the integrated circuit and the reduced size of the integrated circuit, a large number of various devices and the interconnect structures need to be more densely fabricated.

Based on the semiconductor fabrication technology, the transistor device and the interconnect structure is fabricated, involving the inter-layer dielectric (ILD) layer. When the integration level increases, the gap between the circuit route would be reduced. The effect of parasitic capacitance is then more obvious in effect. As usually known, the increase of the parasitic capacitance would cause the increase of resistance-capacitance (RC) effect, which would reduce the operation speed.

At the condition involving the interconnect structure, one manner to reduce the parasitic capacitance may adjust the dielectric material as used, such as the dielectric material with low dielectric constant, so as to reduce the parasitic capacitance.

As usually known, air is also considered as a dielectric material with dielectric constant approaching to 1 and may be the dielectric material having almost the lowest dielectric constant. Thus, in fabricating the semiconductor device, a portion of physical dielectric layer may be replaced by the air gap, so that the averaged dielectric constant may be reduced.

The air gap is not a physical body, in fabrication, it needs to change the design by changing structure of the dielectric layer, so as to form the air gap within the structure of dielectric layer. How to increase the size of the air gap in the dielectric layer is still an issue as to be considered in development. The larger the air gap, the more parasitic capacitance may be reduced.

SUMMARY OF THE INVENTION

The invention provides a semiconductor device and a method for fabricating the semiconductor device and may increase the air gap formed in the ILD layer.

In an embodiment, the invention provides a semiconductor device includes a substrate, having a silicon layer on top. A device structure is disposed on the substrate. A dielectric layer is disposed on the substrate and covering over the device structure. The dielectric layer has a first air gap above the device structure. The first air gap is enclosed by a dielectric wall constituting as a part of the dielectric layer and the dielectric wall is disposed on the device structure. The dielectric layer has a second air gap, exposing a top of the device structure and adjacent to the dielectric wall.

In an embodiment, as to the semiconductor device, it further includes a first contact plug in the dielectric layer at a first side of the device structure to contact the silicon layer. A second contact plug in the dielectric layer at a second side of the device structure to contact the silicon layer. An interconnect structure layer in the dielectric layer, in connection to the first contact plug and the second contact plug.

In an embodiment, as to the semiconductor device, the dielectric layer comprises a first ILD layer, disposed on the substrate and surrounding the device structure, to provide a first part of the dielectric wall, a bottom portion of the first part of the dielectric wall forming as a portion of a bottom portion of the first air gap and an outer side of the bottom portion of the dielectric wall being exposed by the second air gap. A second ILD layer is disposed on the first ILD layer to provide a second part of the dielectric wall, surrounding a middle portion of the first air gap. A third ILD layer, disposed on the second ILD layer to seal the first air gap at a top portion of the first air gap.

In an embodiment, as to the semiconductor device, it further includes a first contact plug and a second contact plug in the first ILD layer, and contacting to the silicon layer.

In an embodiment, as to the semiconductor device, it further includes an interconnection structure layer in the second ILD layer, connecting to the first contact plug and the second contact plug.

In an embodiment, as to the semiconductor device, the top portion of the first air gap also extends into the third ILD layer.

In an embodiment, as to the semiconductor device, the first ILD layer comprises a first liner layer and an oxide layer on the first liner layer. The second ILD layer comprises: a second liner layer on the first ILD layer; a first low-dielectric-constant dielectric layer on the second liner layer; and a third liner layer on the first low-dielectric-constant dielectric layer.

In an embodiment, as to the semiconductor device, the second part of the dielectric wall is wider than the first part of the dielectric wall, wherein a junction portion between the first part and the second part of the dielectric wall has a step-like structure in a cross-section.

In an embodiment, as to the semiconductor device, the first air gap includes an expanding part at a region adjacent to the second ILD layer, transversely extending into the second ILD layer, or the first air gap form a cross-like structure in cross-section view.

In an embodiment, as to the semiconductor device, an outer side wall of the second air gap in cross-section view is a straight wall or a curving wall smoothly extending outward.

In an embodiment, as to the semiconductor device, the second part of the dielectric wall is smoothly joining to the first part of the dielectric wall.

In an embodiment, as to the semiconductor device, an outer side wall of the dielectric wall at a junction region between the first ILD layer and the second ILD layer is a smooth junction or a step-like junction.

In an embodiment, as to the semiconductor device, the third ILD layer is a dielectric layer with low dielectric constant, and covering with sealing over the dielectric wall.

In an embodiment, as to the semiconductor device, the third ILD layer and the dielectric wall are originated from a same material.

In an embodiment, as to the semiconductor device, the first part of the dielectric wall is a cup-like structure, having a bottom surface on the device structure, wherein the second air gap is also on the device structure adjacent to the cup-like structure.

In an embodiment, as to the semiconductor device, a periphery of the second air gap is conformal to a top periphery of the device structure or additionally comprises a portion extending outward.

In an embodiment, as to the semiconductor device, the second air gap does not expose an interconnect structure included in the dielectric layer.

In an embodiment, as to the semiconductor device, the device structure comprises: a gate insulating layer disposed on the silicon layer, a gate layer disposed on the gate insulating layer, and an insulating layer, disposed on the substrate and covering on a top and a sidewall of the gate layer.

In an embodiment, as to the semiconductor device, the substrate is a silicon-on-insulator (SOI) substrate.

In an embodiment, the invention also provides a semiconductor device including a substrate, having a silicon layer on top. A device structure is disposed on the silicon layer. A first ILD layer and a second ILD layer sequentially disposed on the substrate and covering over the device structure. A stack layer of the first ILD layer and the second ILD layer has a first air gap above the device structure. The first air gap is enclosed by a dielectric wall as a part for constituting the first ILD layer and the second ILD layer. The dielectric wall is disposed on a top of the device structure, wherein the first ILD layer has a second air gap exposing the top of the device structure and adjacent to a bottom part of the dielectric wall. A third ILD layer, disposed on the second ILD layer to seal the first air gap from top. The dielectric wall and the third ILD layer are originated from same material.

In an embodiment, as to the semiconductor device, the dielectric wall at the junction region between the first ILD layer and the second ILD layer in cross-section view is a straight junction or extends outward in the second ILD layer to form a step-like junction. A shape of an outer sidewall of the second air gap in cross-section view is a straight wall or a curving wall smoothly extending outward.

In order to make the aforementioned and other objectives and advantages of the present invention comprehensible, embodiments accompanied with figures are described in detail below.

DESCRIPTION OF THE EMBODIMENTS

The invention is directed to semiconductor device and the method for fabricating the semiconductor device. The structure of the semiconductor device in accordance with the intended circuit to be fabricated is fabricated based on the semiconductor fabrication technology. The whole structure of the semiconductor device includes a large number of various devices and the interconnect structure for interconnecting between these device structures. The device structures usually include the transistors as fabricated. The electric connection to the transistor in an example is done by the interconnect structure. The interconnect structure in an example includes the contact plugs which are extending at the vertical direction and multiple conductive routing layers extending at the horizontal direction. These device strictures and the interconnect structure as usually fabricated are supported and isolated by inter-layer dielectric layer.

In the trend as intended for greatly reducing the device size, in an example, the distance between the routings of the interconnect structure is accordingly reduced. Also, the distance between device and the routing is reduced. The non-negligible parasitic capacitance may be induced. Due to the occurrence of parasitic capacitance, it may cause the operation delay.

The invention at least considers how to reduce the effect of parasitic capacitance and proposes the structure of semiconductor device, in which a part of the interconnect structure may be formed by an air gap. In an embodiment, the air gap is effectively increased, as being capable of effectively reducing the parasitic capacitance effect. Taking the transistor as an example, the parasitic capacitance between the source electrode and the drain electrode may be reduced, and then the performance of switch capability for the transistor may be improved.

Multiple embodiments are provided for describing the invention but the invention is not limited to these embodiments and a proper combination between the embodiments may be made.

Figure 1:
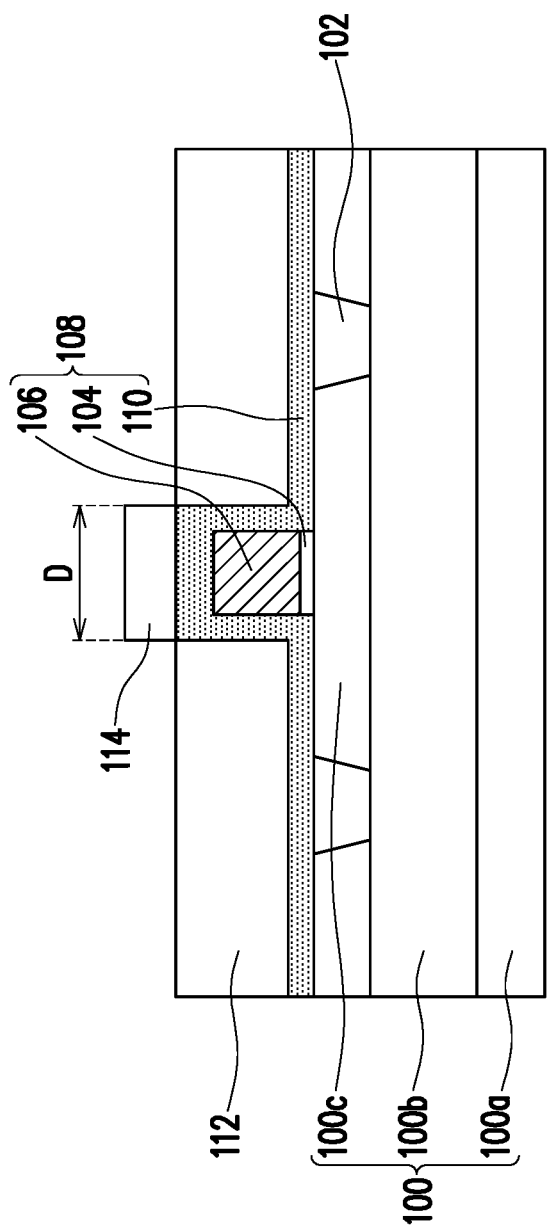
FIG. 1 to FIG. 7 are cross-section drawings, schematically illustrating a flow of a method for fabricating semiconductor device, according to an embodiment of the invention.

FIG. 1 to FIG. 7 are cross-section drawings, schematically illustrating a flow of a method for fabricating semiconductor device, according to an embodiment of the invention. Referring to FIG. 1, in an embodiment, the semiconductor device may be fabricated on a substrate 100. The substrate 100 in an example may be a silicon-on-insulator (SOI) substrate, which includes supporting substrate 100a, an insulating layer 100b and a silicon layer 100c, which are sequentially stacked on the substrate 100. An isolation structure 102 may be formed in the silicon layer 100c on top of the substrate 100 and then the active region may be defined out. The device structure 108 may be formed on the substrate 100. The gate structure 108 of a transistor may be an example for the device structure 100, including gate insulating layer 104 and a gate layer 106. In addition, as the need for actual fabrication, in an embodiment, another insulating layer 110 may be additionally formed to cover the top and the sidewall of the gate layer 106 to insulate and protect the gate layer 106. Thus, the device structure 108 may also include the insulating layer 110, which provides the spacer effect and also provides the effect of etching stop. However, the device structure 108 of the invention is not limited to the gate structure of transistor. Further, the insulating layer 110 may also be modified according to actual need, not the element as absolutely needed. The ILD layer 102 in the device structure 108 may be at the periphery of the device structure 108 and formed with the insulating layer 110 to have a flat surface. The flat surface has the advantage for subsequent fabrication of other structures.

In an embodiment of the invention, a sacrificial layer 114 is also fabricated. The sacrificial layer 114 is used to reserve a space for subsequently forming the air gap, in which the width D may be the same or not the same as the top surface of the device structure 108. In an example, the width may be larger than the top surface of the device structure 108 but the invention is not limited to. The thickness of the sacrificial layer 114 may be acceptable. It just needs to be not touching to the interconnect structure as subsequently fabricated. On the other hand, it has been acceptable that the sacrificial layer 114 is just need to be covered by the ILD layer 116 as subsequently.

The material of the sacrificial layer 114, relative to the insulating layer 110, may be the material, capable of being easily cleaned away, such as Al, Ti, TiN, and so on, which may be easily cleaned by the usual cleaning process. The effect of the sacrificial layer 114 involving in the subsequent fabrication procedures may be described in detail.

Figure 2:
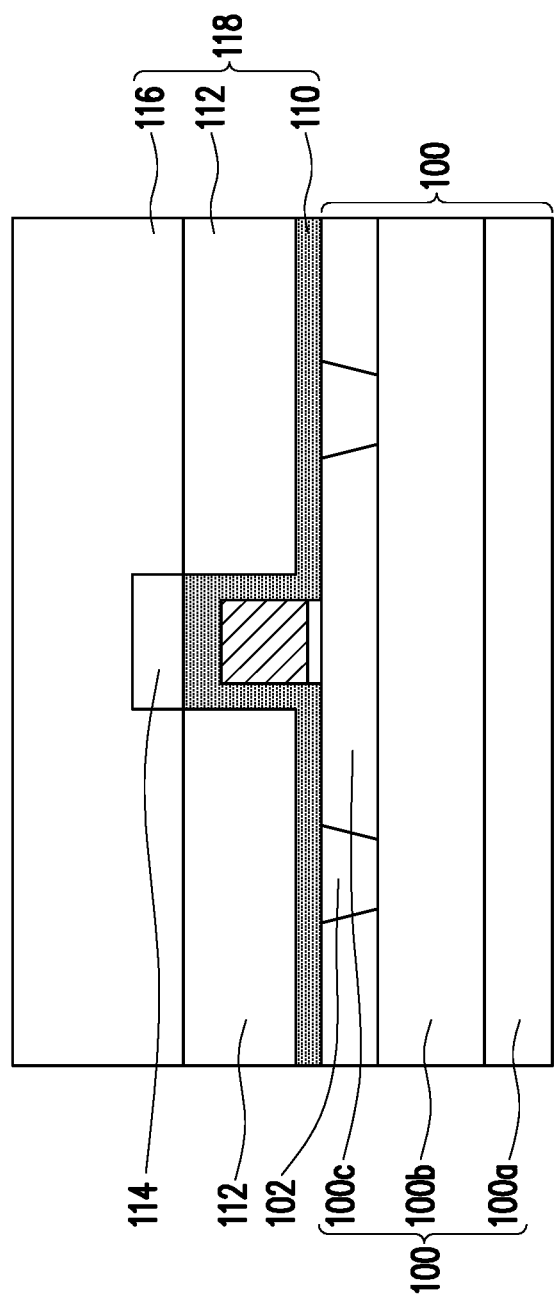

Referring to FIG. 2, The ILD layer 116 is further formed on the ILD layer 112 to cover the sacrificial layer 114. Here, the ILD layer 116 and the ILD layer 112 are merged into the ILD layer 118. Material of the ILD layer 118 in an example is silicon oxide, which has dielectric constant about 4. In addition, the insulating layer 110 as previously formed is also the dielectric material, and the outer region surrounding the device structure 108 is not necessary to be removed and then is treated as a liner layer, as a part of the ILD layer 118. However, the invention is not limited to the material of the ILD layer 118 as provided and may have other dielectric material.

Figure 3:
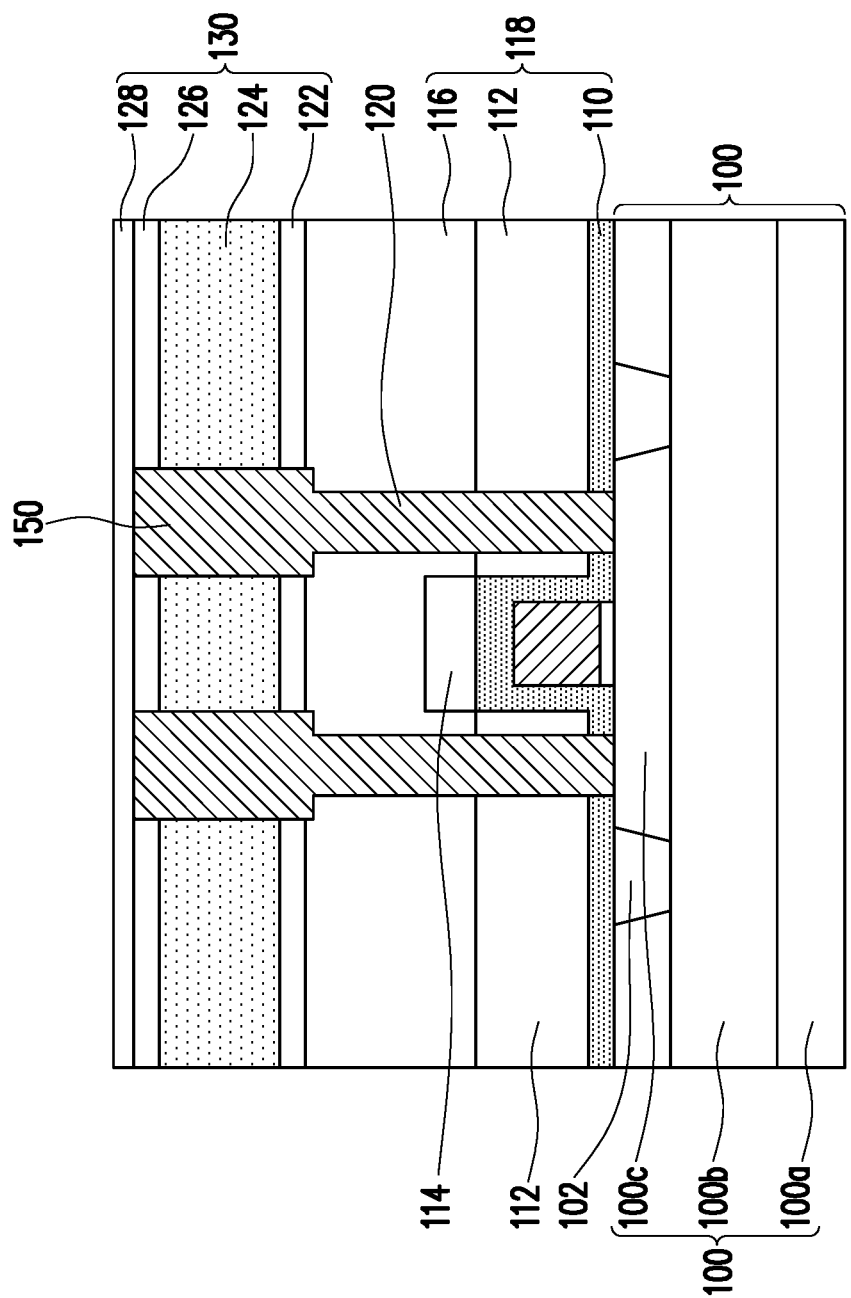

Referring to FIG. 3, the device structure 108 is a gate structure as an example, the silicon layer corresponding to the device structure 108 in an example may be formed to have the source region and the drain region. In an example, the contact plug 120 may be formed in the ILD layer 118, to electrically connect to the device structure 108.

After forming the contact plug 120 in the ILD layer 118, it further needs routing layer to connect to the other device. In an embodiment, another layer of ILD layer 130 is formed on the ILD layer 118. The material of the ILD layer 130 mainly includes the material with low dielectric constant. This low dielectric constant with respect to the silicon oxide is less than 4 in an example. The interconnect structure 150 to be formed in the ILD layer 130 in an example is a routing layer extending at the horizontal direction. Since the ILD layer 130 in an example is the material with low dielectric constant, it is mainly formed from the ILD layer 124, which is in associating with the formation of interconnect structure 150 in the fabrication processes. The ILD layer 130 may also include the liner layer 122, 126 being relatively hard and the liner layer 128 which provides the protection capability. However, the invention is not limited to This embodiment. The ILD layer 130 may include dielectric layers in different stages to the interconnection structure 150. In an embodiment, the ILD layer 130 and the ILD layer 118 are generally combined together to treated as a part of the whole dielectric layer.

Figure 4:
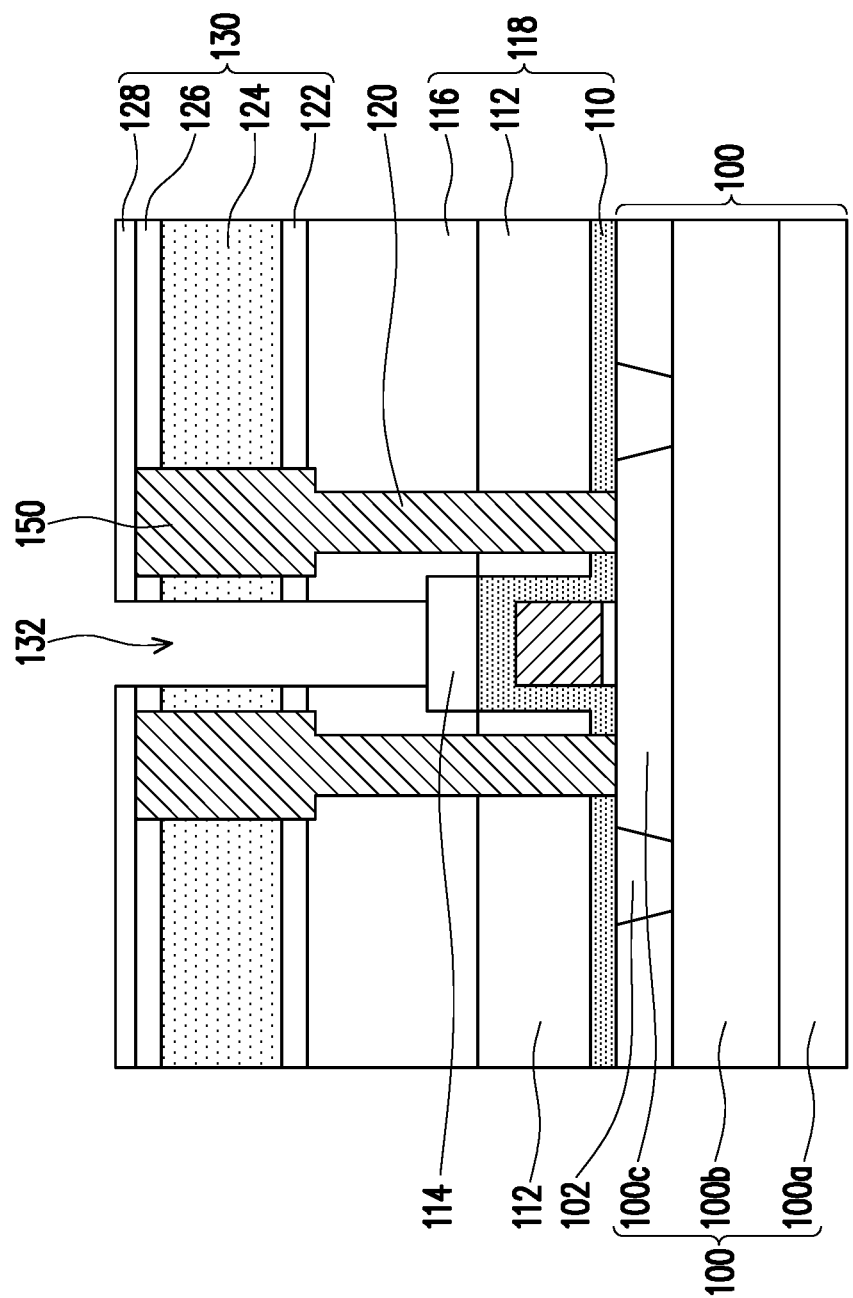

Referring to FIG. 4, a photolithographic and etching process is performed on the liner layer 128, and then an opening 132 is formed in the ILD layer 130 and the ILD layer 118, to expose the sacrificial layer 114.

Figure 5:
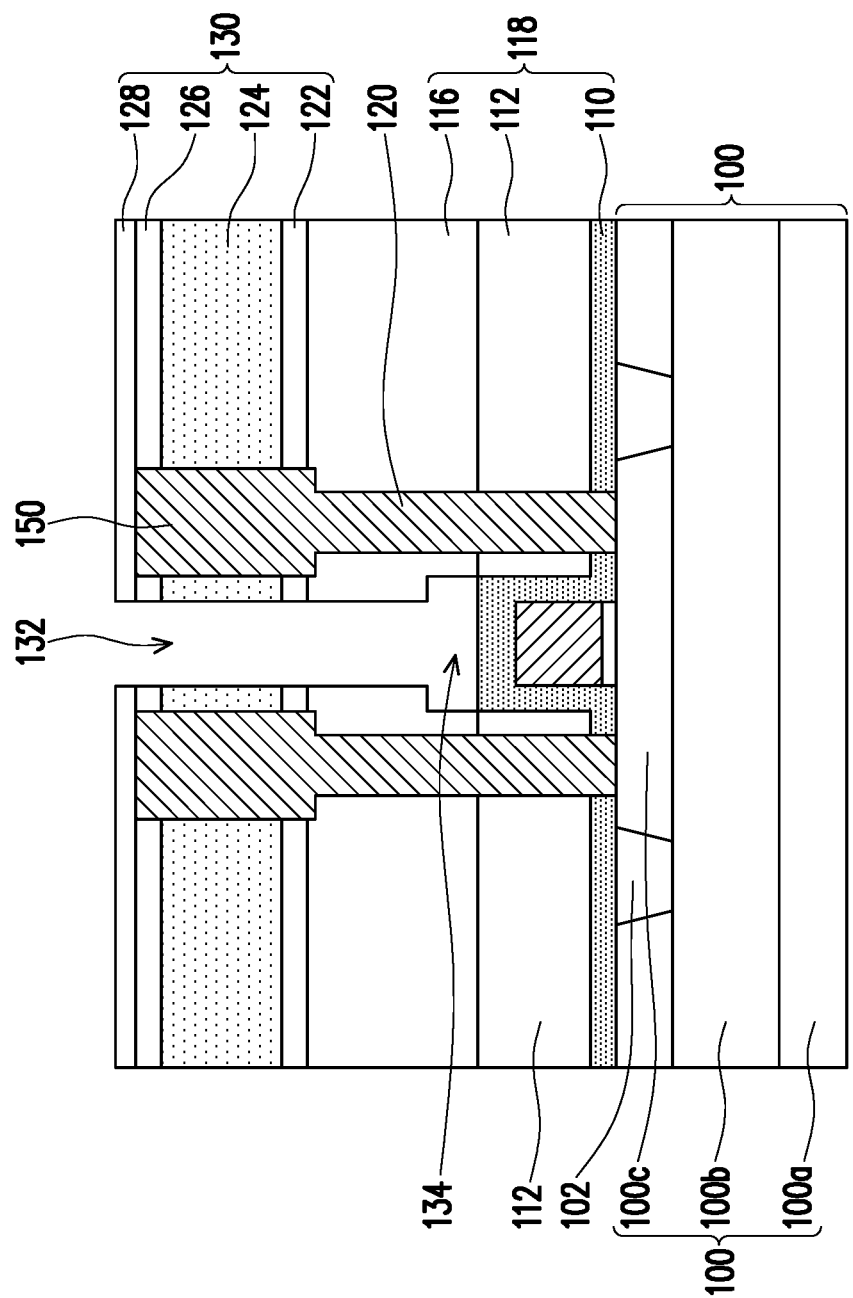

Referring to FIG. 5, as also described in FIG. 1, the material of the sacrificial layer 114 with respect to the dielectric material is different in property, such as Al, Ti, TiN and so on, which may be easily cleaned by the usual cleaning process but the invention is not limited the materials. In an embodiment, the sacrificial layer 114 may be removed through the opening 132 and the ILD layer remains. Thus, a bottom opening 134 is formed and merged with the opening 132 together after he sacrificial layer 114 is removed. The size of the bottom opening 134 is related to the size of the sacrificial layer 114. The bottom opening 134 and the opening 132 are used to form the air gap later in subsequent processes. At the current stage, the bottom opening 134 and the opening 132 are preliminarily formed.

Figure 6:
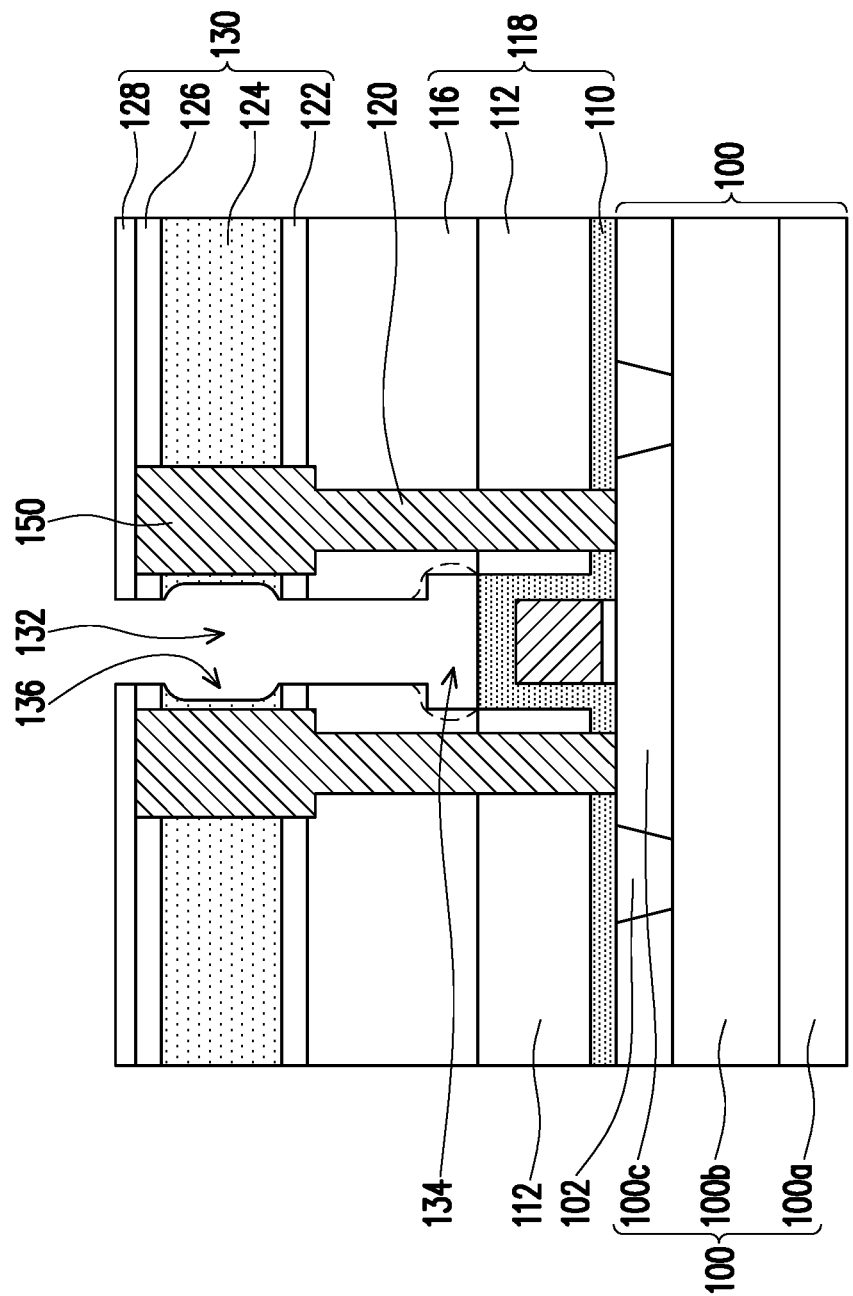

Referring to FIG. 6, the ILD layer 124 is formed by the material with low dielectric constant. It is relatively easy to be processed by oxygen to further remove a a part and then the opening 132 in the range of the ILD layer 124 may be further expanded to form a structure of an expanding part 136. The transverse size is larger than the area of the opening 132.

Here, since the ILD layer 118 is also an oxide, the bottom opening 134 in an example may also be expanded when opening 132 in the ILD layer 124 produces the expanding part 136, so that a smooth sidewall as indicated by dashed line may be formed. The invention is not just limited to the straight sidewall for the bottom opening 134, it is the remaining space after removing the sacrificial layer 114. In an embodiment, the sidewall of the expanding part 136, opening 132 and the bottom opening 134 is processed by oxygen with production of oxide film. After etching process to expand up, the residual oxide film may still remain to form the sidewall of the air gap 140.

Figure 7:
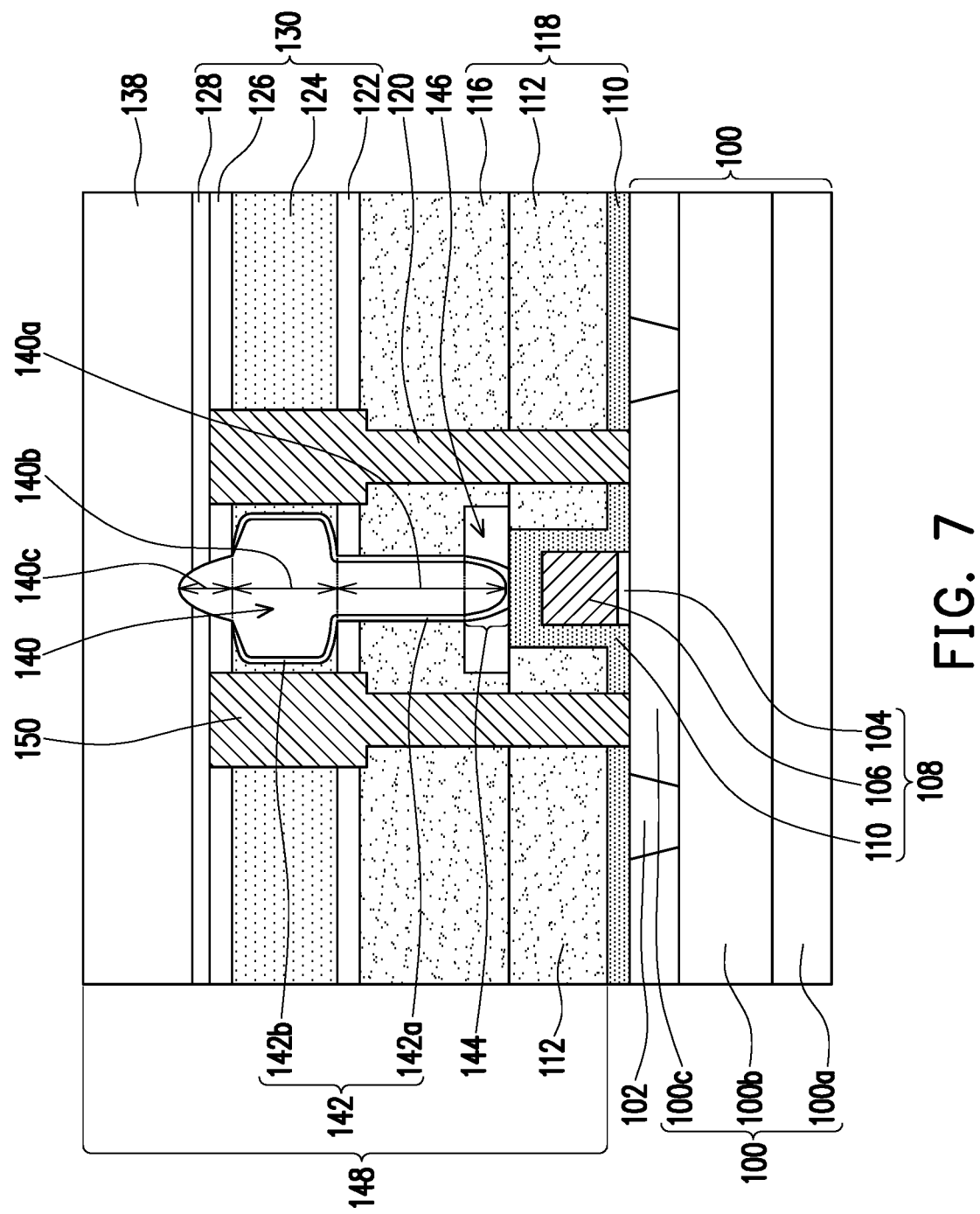

Referring to FIG. 7, another ILD layer 138 is further formed on the ILD layer 130. Since the opening size of the opening 132 is relatively narrow, during depositing the ILD layer 138, it also covers and seals the top of the opening 132 to form the air gap 140. When the ILD layer 138 seals the air gap 140, a top portion 140c of the air gap 140 is formed. The material of the ILD layer 134 in an example is also the material with low dielectric constant, the same as the ILD layer 124. The ILD layer 138, the ILD layer 130 and the ILD layer 118 in an embodiment may be merged together as a dielectric layer 148.

In an embodiment, as to FIG. 6, the location of the interconnect structure 150 may be shifted according to the actual need. The size of the air gap 146 may be adjusted to increase based on the adjustment on the width D of the sacrificial layer 114 in FIG. 1.

In an embodiment, when the ILD layer 138 is formed, a little material would adhere along the sidewall of the opening 132 in the ILD layers 118 and 130 and then enter to the bottom of the bottom opening 134 and stop on a part of the top of the device structure 108. In this situation, a portion of the bottom opening 134 out of the dielectric wall 142 still remains, and effectively add the formation of another air gap 146, adjacent to the dielectric wall 142.

In an embodiment, as viewed from cross-section of the structure, the first ILD layer 118 is disposed on the substrate 100 and surrounds the device structure 108 to provide a first part 142a of the dielectric wall, capable of defining out a corresponding portion of the air gap 140. Here, to describe the regions with better clarity, the dotted line as indicated is to schematically show the ranges of the corresponding regions, in which the dotted line is not a physical structure. The dielectric wall 142 generally is referring to the part as naturally formed by deposition on the exposed surface of the air gap 140 corresponding to the ILD layer 130 and the ILD layer 118 while the ILD layer 138 is formed. The dielectric wall 142 then defines the air gap 140. A first part 142a of the dielectric wall 142 is the lower part, including the bottom part 144 to form as a portion of the bottom portion 140a of the air gap 140. The outside of the bottom part 144 of the dielectric wall 142 is exposed by the air gap 146. In an embodiment, the dielectric wall 142 as divided by the dotted line includes a second part 142b at the upper region. The second part 142b in an example is referring to the part corresponding to the ILD layer 124. It may also include the expanding part 136 as also shown in FIG. 6. In general, the dielectric wall 142 is referring to the sidewall surrounding the air gap 140. As generally viewed, the dielectric wall 142 may also be belonging to a part of the ILD layer.

In an embodiment, the second ILD layer 130 is disposed on the first ILD layer 118 to provide the second part 142b of the dielectric wall 142, surrounding the middle portion 140b of the air gap 140. Here, the air gap 140 includes the bottom portion 140a and the middle portion 140b and also includes the top portion 140c while the third ILD layer 138 is formed. The third ILD layer 138 is disposed on the second ILD layer 130 and seals the air gap 140 from the top. In other words, the air gap 140 may generally divided into regions of bottom portion 140a, the middle portion and the top portion 140c, in which the dielectric wall 142 to form the middle portion 140b in an embodiment may include the expanding part due to the use of oxygen process as foregoing described. As viewed on shape of the air gap 140, the middle portion 140 is wider than the bottom portion 140a and the top portion 140c. As viewed in cross-section, it may be the cross-like shape.

In an embodiment, the second part 142b of the dielectric wall 142 as described in FIG. 6, the expanding part 136 is produced after oxygen process, and then is wider than the first part 142a of the dielectric wall 142. A junction region between the first part 142a and the second part 142b of the dielectric wall 142 may also be a step-like structure as viewed in cross-section.

In an embodiment, the air gap 140 at a region adjacent to the second ILD second ILD layer 130 with the expanding part 136 as shown in FIG. 6 may transversely expand into the second ILD layer 130. In other words, the shape of the air gap 140 in cross-section may be a cross-like shape.

In an embodiment, shape of an outer side wall of the air gap 146 in cross-section view is a straight wall or a curving wall smoothly extending outward as shown in FIG. 6.

In an embodiment, the second part 142b of the dielectric wall 142 is smoothly joining to the first part 142a of the dielectric wall 142.

In an embodiment, an outer side wall of the dielectric wall 142 at a junction region between the first ILD layer 118 and the second ILD layer 130 is a smooth junction or a step-like junction.

In an embodiment, the third ILD layer 138 is a dielectric layer with low dielectric constant, and covering with sealing over the dielectric wall 142.

In an embodiment, the third ILD layer 138 and the dielectric wall 142 are originated from a same material, as the formation in the same depositing process in an example.

In an embodiment, the first part 142a of the dielectric wall 142 is a cup-like structure, having a bottom surface on the device structure 108, wherein the air gap 146 is also on the device structure 108 adjacent to the cup-like structure.

In an embodiment, a periphery of the air gap 146 is conformal to a top periphery of the device structure 108 or additionally comprises a portion extending outward.

Figure 8:
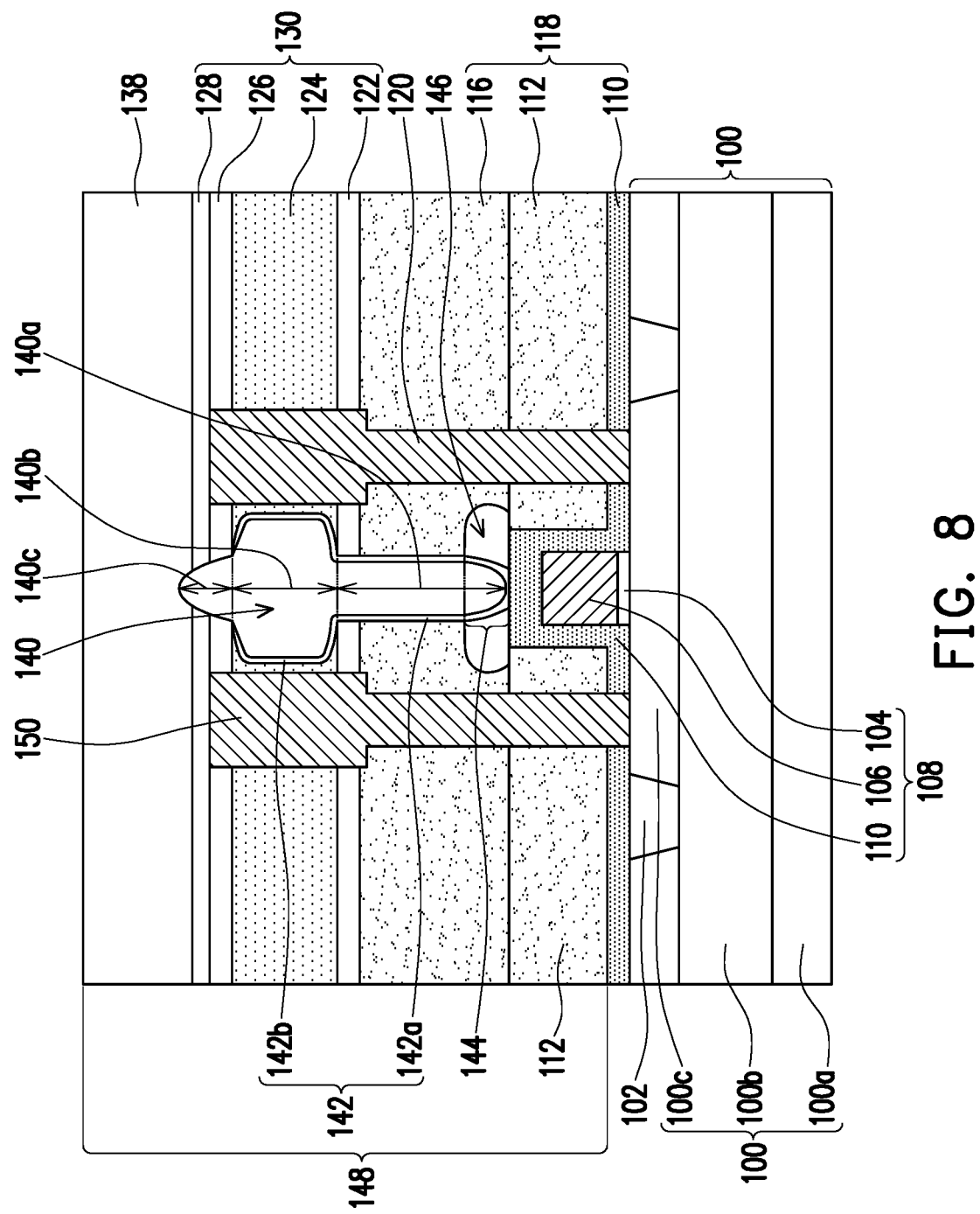
FIG. 8 is a drawing, schematically illustrating a cross-section structure of a semiconductor device, according to an embodiment of the invention.

FIG. 8 is a drawing, schematically illustrating a cross-section structure of a semiconductor device, according to an embodiment of the invention. Referring to FIGS. 6-8, as to the structure of the air gap 140 and the air gap 146 as described in FIG. 7, the outer shape of the air gap 146 as described in FIG. 6 may be relatively a smooth surface in an embodiment. In other words, the outer profile of the air gap 146 may have other shapes. The invention is not limited to the profile as provided.

Figure 9:
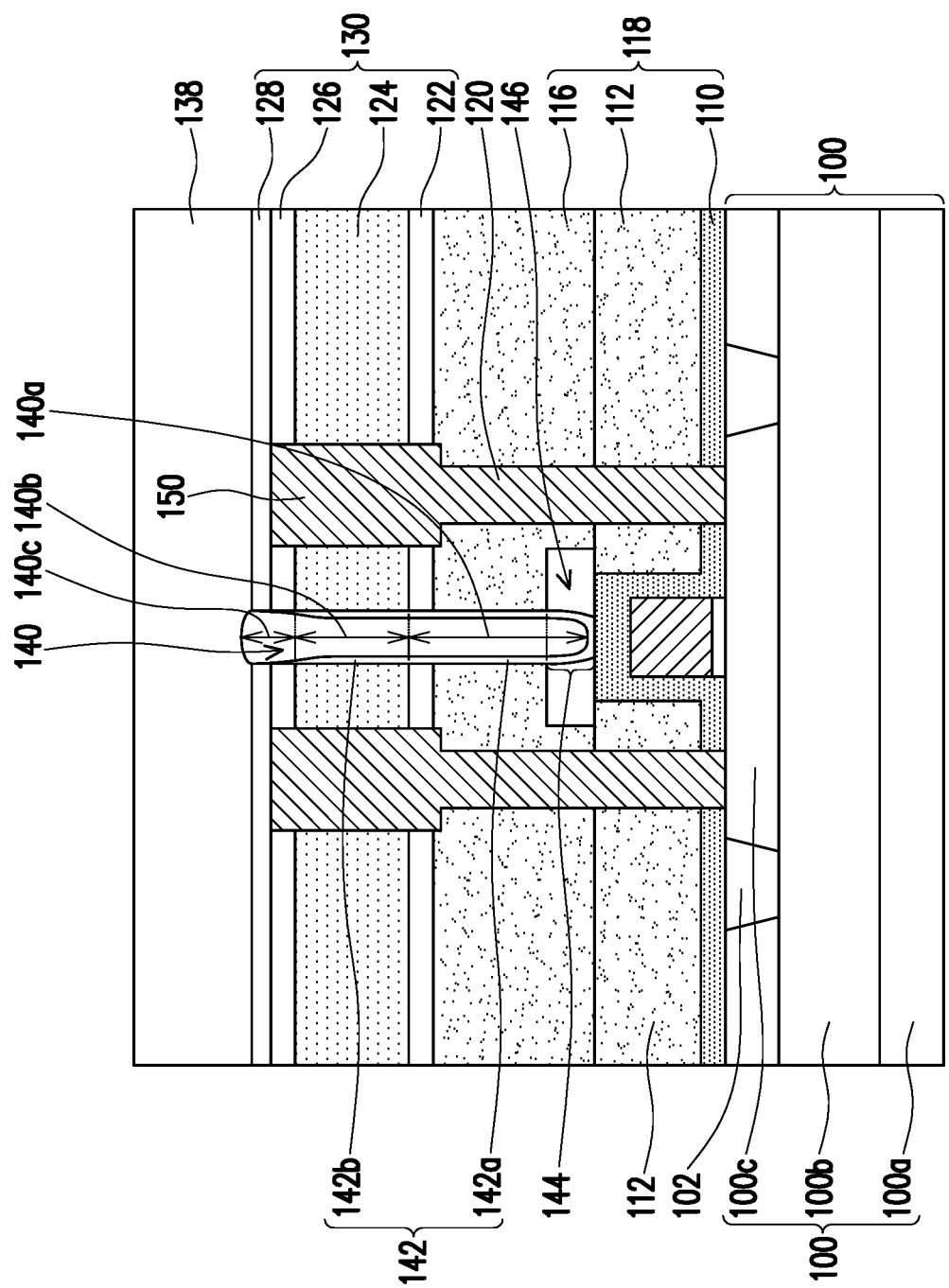
FIG. 9 is a drawing, schematically illustrating a cross-section structure of a semiconductor device, according to an embodiment of the invention.

FIG. 9 is a drawing, schematically illustrating a cross-section structure of a semiconductor device, according to an embodiment of the invention. Referring to FIGS. 5, 7 and 8, as to the structure of the air gap 140 and the air gap 146 as described in FIG. 7, the outer shape of the air gap 140 as described in FIG. 5 may be not need to have the expanding part 136. Thus, a junction region between the first part 142a and the second part 142b of the dielectric layer 142 has be bending structure. The middle portion 140b and the bottom portion 140a of the air gap 140 remains the width as etched, basically remaining the same width in an example.

In general, the sacrificial layer 114 is firstly formed in FIG. 1. The sacrificial layer 114 in removed in the subsequent fabrication process. The remaining space may add the air gap 146 at the bottom. In other words, the total volume of the air gap is increased. In an example, it may be applied to the transistor device, so that the switch voltage of the transistor may be reduced, and it has the advantage for switch operation.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A semiconductor device, comprising:
   a substrate, having a silicon layer on top;
   a device structure, disposed on the substrate; and
   a dielectric layer, disposed on the substrate and covering over the device structure,
   wherein the dielectric layer has a first air gap above the device structure, the first air gap is enclosed by a dielectric wall constituting as a part of the dielectric layer and the dielectric wall is disposed on the device structure,
   wherein the dielectric layer has a second air gap, exposing a top of the device structure and adjacent to the dielectric wall, and
   wherein the dielectric layer comprises: a first inter-layer dielectric (ILD) layer, disposed on the substrate and surrounding the device structure, to provide a first part of the dielectric wall, a bottom portion of the first part of the dielectric wall forming as a portion of a bottom portion of the first air gap and an outer side of the bottom portion of the dielectric wall being exposed by the second air gap.

2. The semiconductor device of claim 1, further comprising:
   a first contact plug in the dielectric layer at a first side of the device structure to contact the silicon layer;
   a second contact plug in the dielectric layer at a second side of the device structure to contact the silicon layer; and
   an interconnect structure layer in the dielectric layer, in connection to the first contact plug and the second contact plug.

3. The semiconductor device of claim 1, wherein the dielectric layer further comprises:
   a second ILD layer, disposed on the first ILD layer to provide a second part of the dielectric wall, surrounding a middle portion of the first air gap; and
   a third ILD layer, disposed on the second ILD layer to seal the first air gap at a top portion of the first air gap.

4. The semiconductor device of claim 3, further comprising a first contact plug and a second contact plug in the first ILD layer, and contacting to the silicon layer.

5. The semiconductor device of claim 4, further comprising an interconnection structure layer in the second ILD layer, connecting to the first contact plug and the second contact plug.

6. The semiconductor device of claim 3, wherein the top portion of the first air gap also extends into the third ILD layer.

7. The semiconductor device of claim 3, wherein
the first ILD layer comprises a first liner layer and an oxide layer on the first liner layer,
the second ILD layer comprises:
a second liner layer on the first ILD layer;
a first low-dielectric-constant dielectric layer on the second liner layer; and
a third liner layer on the first low-dielectric-constant dielectric layer.

8. The semiconductor device of claim 3, wherein the second part of the dielectric wall is wider than the first part of the dielectric wall, wherein a junction portion between the first part and the second part of the dielectric wall has a step-like structure in a cross-section.

9. The semiconductor device of claim 3, wherein the first air gap includes an expanding part at a region adjacent to the second ILD layer, transversely extending into the second ILD layer, or the first air gap form a cross-like structure in cross-section view.

10. The semiconductor device of claim 3, wherein an outer side wall of the second air gap in cross-section view is a straight wall or a curving wall smoothly extending outward.

11. The semiconductor device of claim 3, wherein the second part of the dielectric wall is smoothly joining to the first part of the dielectric wall.

12. The semiconductor device of claim 3, wherein an outer side wall of the dielectric wall at a junction region between the first ILD layer and the second ILD layer is a smooth junction or a step-like junction.

13. The semiconductor device of claim 3, wherein the third ILD layer is a dielectric layer with low dielectric constant, and covering with sealing over the dielectric wall.

14. The semiconductor device of claim 3, wherein the third ILD layer and the dielectric wall are originated from a same material.

15. The semiconductor device of claim 1, wherein the first part of the dielectric wall is a cup-like structure, having a bottom surface on the device structure, wherein the second air gap is also on the device structure adjacent to the cup-like structure.

16. The semiconductor device of claim 1, wherein a periphery of the second air gap is conformal to a top periphery of the device structure or additionally comprises a portion extending outward.

17. The semiconductor device of claim 1, wherein the second air gap does not expose an interconnect structure included in the dielectric layer.

18. The semiconductor device of claim 1, wherein the device structure comprises:
a gate insulating layer disposed on the silicon layer;
a gate layer disposed on the gate insulating layer; and
an insulating layer, disposed on the substrate and covering on a top and a sidewall of the gate layer.

19. The semiconductor device of claim 1, wherein the substrate is a silicon-on-insulator (SOI) substrate.

20. A semiconductor device, comprising:
a substrate, having a silicon layer on top;
a device structure, disposed on the silicon layer;
a first inter-layer dielectric (ILD) layer and a second ILD layer sequentially disposed on the substrate and covering over the device structure, wherein a stack layer of the first ILD layer and the second ILD layer has a first air gap above the device structure, the first air gap is enclosed by a dielectric wall as a part for constituting the first ILD layer and the second ILD layer, the dielectric wall is disposed on a top of the device structure, wherein the first ILD layer has a second air gap exposing the top of the device structure and an outer side of a bottom part of the dielectric wall; and
a third ILD layer, disposed on the second ILD layer to seal the first air gap from top,
wherein the dielectric wall and the third ILD layer are originated from same material.

21. The semiconductor device of claim 20, wherein the dielectric wall at the junction region between the first ILD layer and the second ILD layer in cross-section view is a straight junction or extends outward in the second ILD layer to form a step-like junction,
wherein a shape of an outer sidewall of the second air gap in cross-section view is a straight wall or a curving wall smoothly extending outward.

* * * * *